(12) United States Patent
Kobayashi et al.

(10) Patent No.: US 8,097,523 B2
(45) Date of Patent: Jan. 17, 2012

(54) METHOD FOR MANUFACTURING BONDED WAFER

(75) Inventors: Norihiro Kobayashi, Annaka (JP); Tohru Ishizuka, Annaka (JP); Hiroji Aga, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/866,271

(22) PCT Filed: Feb. 17, 2009

(86) PCT No.: PCT/JP2009/000625
§ 371 (c)(1),
(2), (4) Date: Aug. 5, 2010

(87) PCT Pub. No.: WO2009/110174
PCT Pub. Date: Sep. 11, 2009

(65) Prior Publication Data
US 2011/0104870 A1 May 5, 2011

(30) Foreign Application Priority Data

Mar. 6, 2008 (JP) .................................. 2008-055714

(51) Int. Cl.
*H01L 21/30* (2006.01)
*H01L 21/46* (2006.01)

(52) U.S. Cl. . 438/455; 438/458; 438/459; 257/E21.568; 257/E21.57

(58) Field of Classification Search .................. 438/455, 438/458, 459; 257/E21.568, E21.57
See application file for complete search history.

(56) References Cited

U.S. PATENT DOCUMENTS

| 6,458,680 | B2 * | 10/2002 | Chung et al. | 438/597 |
| 6,875,633 | B2 * | 4/2005 | Fukunaga | 438/107 |
| 2005/0218111 | A1 * | 10/2005 | Maleville et al. | 216/33 |
| 2006/0014330 | A1 | 1/2006 | Ichikawa et al. | |
| 2007/0020947 | A1 | 1/2007 | Daval et al. | |

(Continued)

FOREIGN PATENT DOCUMENTS

FR 2 888 663 1/2007

(Continued)

OTHER PUBLICATIONS

International Search Report issued in Application No. PCT/JP2009/000625; Dated Mar. 24, 2009.

(Continued)

*Primary Examiner* — Hsien Ming Lee
(74) *Attorney, Agent, or Firm* — Oliff & Berridge, PLC

(57) ABSTRACT

A method for manufacturing a bonded wafer, including at least implanting at least one type of gas ion selected from a hydrogen ion and a rare gas ion from a surface of a bond wafer to form an ion-implanted layer in the wafer, bonding an ion-implanted surface of the bond wafer to a surface of a base wafer directly or through an insulator film, and then delaminating the bond wafer at the ion-implanted layer to fabricate a bonded wafer. A plasma treatment is applied to a bonding surface of one of the bond wafer and the base wafer to grow an oxide film, etching the grown oxide film is carried out, and bonding to the other wafer is performed. The method enables preventing defects by reducing particles on the bonding surface and performing strong bonding when effecting bonding directly or through the insulator film.

6 Claims, 1 Drawing Sheet

U.S. PATENT DOCUMENTS

| | | | |
|---|---|---|---|
| 2008/0138959 A1* | 6/2008 | Yokokawa et al. | 438/458 |
| 2008/0200010 A1* | 8/2008 | Endo et al. | 438/458 |
| 2008/0299376 A1 | 12/2008 | Ito et al. | |
| 2009/0023267 A1 | 1/2009 | Daval et al. | |
| 2010/0096733 A1 | 4/2010 | Guiot et al. | |

FOREIGN PATENT DOCUMENTS

| | | |
|---|---|---|
| FR | 2 913 528 | 9/2008 |
| JP | A-05/082404 | 4/1993 |
| JP | A-2004-193515 | 7/2004 |
| WO | WO 2007/074550 A1 | 7/2007 |
| WO | WO 2008/021747 A2 | 2/2008 |

OTHER PUBLICATIONS

International Preliminary Report on Patentability issued in Application No. PCT/JP2009/000625; Dated Oct. 12, 2010.

Mar. 22, 2011 European Search Report issued in EP 09717166.

Jul. 26, 2011 Chinese Office Action issued in Chinese Patent Application No. 200980107575.0 (with partial translation).

* cited by examiner

[Figs. 1]
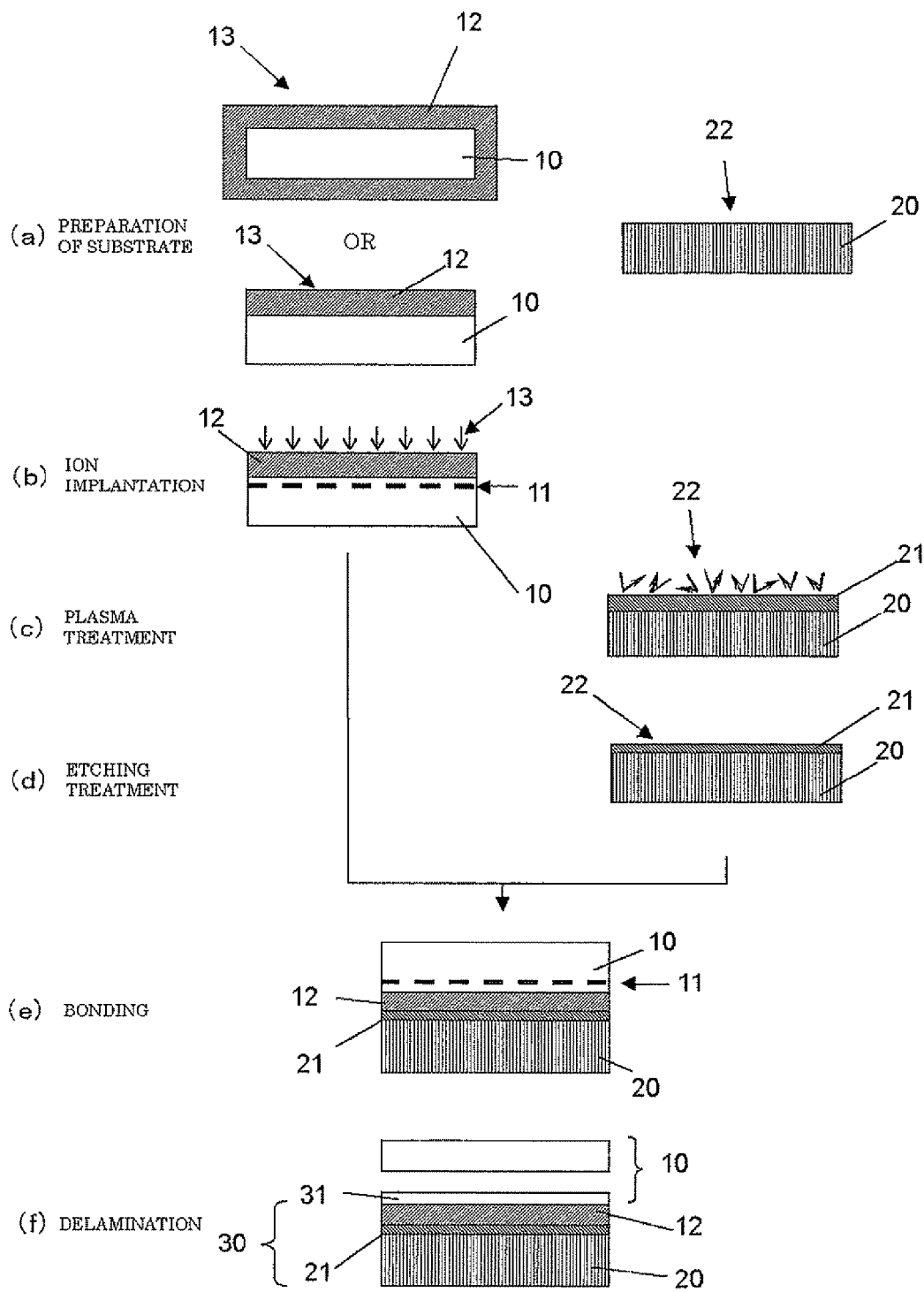

METHOD FOR MANUFACTURING BONDED WAFER

TECHNICAL FIELD

The present invention relates to a method for manufacturing a bonded wafer using an ion-implantation delamination method, and typically relates to a method for manufacturing a bonded wafer by bonding a wafer having, e.g., a hydrogen ion implanted therein to the other wafer and then delaminating the same.

BACKGROUND ART

When manufacturing a bonded SOI wafer by an ion-implantation delamination method, processing such as formation of an insulator film, hydrogen ion implantation, bonding, a delamination heat treatment and others are required. In an SOI wafer after the delamination heat treatment in particular, a defect in a bonding interface called a void or a blister is generated. This defect is strongly dependent on the delamination heat treatment and a previous process thereof. As one of causes, there is a particle that adheres during each process. In particular, defects tend to be generated more often as a thickness of a buried insulator film (BOX) is reduced.

When fabricating an SOI wafer, there is a tendency that the number of defects increases as a thickness of a BOX decreases to 100 nm or below, and defects are generated due to, e.g., particles in a previous process including a delamination heat treatment even if the BOX is as thick as 100 nm or above.

As such defects, there are a blister and a void that can be visually confirmed, and an LPD (Light Point Defect) that is detected by a particle counter, and others. However, using SEM and others for observation, an actual figure of the LPD is a small void. These defects must be reduced and eliminated as much as possible, and, in particular, defects in an SOI wafer having a thin BOX or in a direct bonded wafer having no BOX where defects are apt to be generated must be reduced.

To reduce defects, although there is a method of improving rigidity by increasing an implantation depth of a hydrogen ion to enlarge a thickness of an SOI layer, an effect thereof becomes insufficient when a thickness of the BOX is small. Further, when the hydrogen ion is deeply implanted, an amount of reducing a thickness of the SOI layer by, e.g., sacrificial oxidation in a post-process increases, a process time is prolonged, and an SOI film thickness distribution tends to be degraded.

As another method of reducing defects, there is also a method of performing a plasma treatment for exposing a bonding surface to a plasma to activate the bonding surface, thereby improving bonding strength. As a standard process thereof, plasma activation+aqueous cleaning+bonding is recommended. For example, Patent Document 1 discloses a method of performing a plasma treatment to form an oxide film, cleaning a surface of this film with pure water, drying the same and then effecting bonding (see Japanese Patent Application Laid-open No. 05-82404).

However, a reduction in defects (voids or blisters) in a bonding interface is not sufficient even though a bonded wafer is manufactured based on such a method.

DISCLOSURE OF INVENTION

In view of the above-described problem, it is, therefore, an object of the present invention to provide a method for manufacturing a bonded wafer that can prevent defects from being generated in a thin film of a bonded wafer by reducing particles on a bonding surface and performing strong bonding when bonding directly or via an insulator film.

To achieve this object, according to the present invention, there is provided a method for manufacturing a bonded wafer, the method including at least the steps of implanting at least one type of gas ion selected from a hydrogen ion and a rare gas ion from a surface of a bond wafer to form an ion-implanted layer in the wafer, bonding an ion-implanted surface of the bond wafer to a surface of a base wafer directly or through an insulator film, and then delaminating the bond wafer at the ion-implanted layer to fabricate a bonded wafer, wherein a plasma treatment is applied to a bonding surface of at least one of the bond wafer and the base wafer to grow an oxide film, a treatment of etching the grown oxide film is carried out, and then bonding to the other wafer is performed.

According to such a method for manufacturing a bonded wafer, the surface of the oxide film of the bonding surface to which particles are apt to be attached in particular due to the plasma treatment and from which the attached particles are hard to be removed can be etched to remove the attached particles and portions affected by the particles. As a result, the bonding surface having less particles can be obtained, and strong bonding can be realized, whereby defects generated in the thin film of the fabricated bonded wafer can be greatly reduced.

At this time, it is preferable to carry out the treatment of etching the oxide film by immersion in an SC1 solution and an SC2 solution.

As described above, according to the etching treatment in the manufacturing method of the present invention, since defects can be greatly reduced by slightly etching the surface of the oxide film grown based on the plasma treatment, particles can be sufficiently decreased even though the SC1 solution (an aqueous solution of $NH_4OH$ and $H_2O_2$) and the SC2 solution (an aqueous solution of HCl and $H_2O_2$) having relatively low etching rates are used, an etching amount can be readily adjusted, and uniformly etching the entire surface of the oxide film is easy.

Further, it is preferable to apply the plasma treatment to the bonding surface of the base wafer to grow the oxide film, carry out the treatment of etching the grown oxide film, and then bond to the bond wafer.

As described above, performing the plasma treatment and the etching treatment according to the present invention to the bonding surface of the base wafer enables further reducing defects generated in the bonding surface, whereby defects generated in the thin film of the bonded wafer to be fabricated can be effectively avoided.

At this time, it is preferable to carry out the etching to reduce a film thickness of the oxide film by 0.3 nm or above and less than 2 nm in the treatment of etching the oxide film grown on the bonding surface of the base wafer.

When the etching is performed with the film thickness of the oxide film to be etched falling within the above-described range as described above, generation of defects in the bonding interface can be further reduced, and defects in the thin film of the fabricated bonded wafer can be extremely decreased.

Furthermore, it is preferable to form an insulator film on the surface of the bond wafer alone in advance.

In application of the manufacturing method according to the present invention, when the insulator film is formed on the surface of the bond wafer, ions are implanted through this insulator film, and then the bond wafer is bonded to the base wafer having no insulator film formed thereon, defects in the thin film of the bonded wafer to be fabricated can be further reduced.

Moreover, the plasma treatment can be performed by using an oxygen plasma or a nitrogen plasma.

In the manufacturing method according to the present invention, a plasma can be appropriately selected from these plasmas, and the oxide film can be formed even though the nitrogen plasma is used.

According to the method for manufacturing a bonded wafer of the present invention as described above, since particles that have attached to the plasma-treated surface can be removed by etching together with the oxide film grown by the plasma treatment, the bonding surface having the particles greatly reduced can be obtained. As a result, strong bonding can be realized by the plasma treatment, and the bonding interface that rarely has defects can be formed, whereby defects generated in the thin film of the bonded wafer to be fabricated can be effectively reduced. Moreover, since the manufacturing method according to the present invention can be applied to both a direct bonded wafer and an SOI wafer, defects generated in the thin film of a variety of bonded wafers can be reduced.

BRIEF DESCRIPTION OF DRAWINGS

FIG. 1 is a flowchart showing an example of steps in a method for manufacturing a bonded wafer according to the present invention.

BEST MODE(S) FOR CARRYING OUT THE INVENTION

There is a problem that defects are generated in a surface of a thin film or an interface between a base wafer and the thin film at the time of manufacturing a bonded wafer, and, in particular, the number of defects is large at the time of manufacturing an SOI wafer having a thin buried insulator film (BOX) or a direct bonded wafer.

As a result of keenly conducting examination about these defects, the present inventors have revealed that defects generated in a thin film of a bonded wafer to be fabricated can be greatly reduced by growing an oxide film on a bonding surface by a plasma treatment, decreasing a thickness of the oxide film by etching and then effecting bonding, thereby bringing the present invention to completion.

The method for manufacturing a bonded wafer according to the present invention will now be described in detail in regard to an embodiment of manufacturing the bonded wafer based on an ion-implantation delamination method with reference to FIG. 1, but the present invention is not restricted thereto.

It is to be noted that FIG. 1 is a flowchart showing an example of an embodiment of the method for manufacturing a bonded wafer according to the present invention.

First, at a step (a) in FIG. 1, two mirror-polished silicon single crystal wafers are prepared as a bond wafer 10 and a base wafer 20.

At this time, as shown in FIG. 1, an insulator film 12 is formed in advance on the bond wafer 10 alone, but the insulator film 12 may be formed on the base wafer 20 alone or may be formed on both the wafers, and it may not be formed on any one of the wafers. As described above, according to the manufacturing method of the present invention, defects can be reduced in both cases of bonding through the insulator film and bonding directly, but defects in a thin film of the bonded wafer can be decreased at a maximum when the insulator film is formed on the surface of the bond wafer alone. Although a cause of particularly reducing defects in such a situation is unknown for certain, it is presumed that OH group or a concentration of moisture that is present on bonding surfaces of both the wafers concerns.

As the insulator film to be formed at this time, for example, a thermal oxide film or a CVD oxide film can be formed. It is to be noted that the insulator film formed on each wafer may be formed on entire surfaces of the wafer including a back surface or may be formed on the bonding surface alone.

Then, at a step (b), at least one type of gas ion selected from a hydrogen ion and a rare gas ion is ion-implanted from the surface (a bonding surface 13) of the insulator film 12 on the bond wafer 10 to form an ion-implanted layer 11 in the wafer. At this time, other ion implantation conditions, e.g., implantation energy, an implantation dose, an implantation temperature and others can be appropriately selected so that the thin film having a predetermined thickness can be obtained.

At a step (c), a bonding surface 22 of the base wafer 20 is subjected to a plasma treatment to grow an oxide film 21.

At this time, the insulator film 12 of the bond wafer 10 alone may be subjected to the plasma treatment to grow the oxide film, or both the wafers may be subjected to the plasma treatment to grow the oxide film. It is to be noted that, when the bonding surface of the base wafer is subjected to the plasma treatment to grow the oxide film and the oxide film is etched at a subsequent step (d), defects generated in the thin film of the fabricated bonded wafer can be further reduced. Although a cause of particularly reducing defects in such a situation is unknown, it is presumed that OH group or a concentration of moisture that is present in the bonding surfaces of both the wafers concerns.

As the plasma treatment for exposing the bonding surface to a plasma, a treatment that enables growing the oxide film on the wafer surface can suffice and, although not restricted in particular, for example, an oxygen plasma or a nitrogen plasma can be used. Even if the nitrogen plasma is adopted, the oxide film can be grown by using oxygen remaining in a chamber.

As described above, when the plasma treatment is carried out, the treated surface is activated due to, e.g., an increase in OH group, and the wafers can be firmly bonded by, e.g., hydrogen bonding at the time of bonding.

At the step (d), the oxide film 21 grown on the bonding surface 22 of the base wafer 20 is etched.

When the grown oxide film is etched in this manner, the surface of the plasma-treated surface from which particles are hardly removed can be etched to remove portions affected by particles, and defects in the bonding interface can be avoided, thereby decreasing defects generated in the thin film of the bonded wafer to be fabricated.

Additionally, when etching the oxide film grown on the bonding surface of the base wafer by the plasma treatment, it is preferable to effect etching to reduce a film thickness of the oxide film by 0.3 nm or above and less than 2 nm. Although the effect of the present invention can be demonstrated if the surface of the oxide film is etched to be removed by, for example, just effecting etching 0.1 nm, performing etching removal with respect to the film thickness falling within the above-described range enables assuredly reducing defects in the thin film of the bonded wafer to be fabricated.

Although a method for performing etching is not restricted in particular, performing etching by, e.g., immersing in an SC1 solution and an SC2 solution is preferable. Since the bonding interface having less defects can be obtained by slightly etching the oxide film grown based on the plasma treatment, the above-described solutions having relatively low etching rates enable facilitating adjustment of an etching amount and uniformly etching the surface of the oxide film, thereby providing the more excellent bonding surface.

At a step (e), bonding is effected while the insulator film 12 on the bond wafer 10 being appressed against the oxide film 21 on the base wafer 20.

When the surfaces subjected to the plasma treatment are determined as the bonding surfaces and both the wafers are appressed against each other under, e.g., a reduced pressure or an ordinary pressure, sufficiently strong bonding can be realized without carrying out a high-temperature treatment and others.

At a step (f), the bond wafer 10 is delaminated at the ion-implanted layer 11 to fabricated a bonded wafer 30 in which a thin film 31 is formed on the base wafer 20 through the insulator film 12.

This delamination of the bond wafer can be carried out by applying a heat treatment or mechanical external force. As a method of performing delamination based on the heat treatment, for example, applying the heat treatment in an inert gas atmosphere at a temperature not lower than approximately 500° C. enables delaminating the bond wafer at the ion-implanted layer due to crystal rearrangement and bubble aggregation.

As described above, according to the present invention, since strong bonding and bonding having no particle on the bonding interface can be simultaneously achieved, defects generated in the thin film of the bonded wafer to be fabricated can be greatly reduced.

The present invention will now be more specifically described hereinafter based on examples and comparative examples, but the present invention is not restricted thereto.

Example 1

Two mirror-polished silicon single crystal wafers each having a diameter of 300 mm were prepared as a bond wafer and a base wafer, a thermal oxide film having a film thickness of 20 nm was formed on a surface of the bond wafer as an insulator film. Subsequently, a hydrogen ion was implanted through the thermal oxide film on the bond wafer under conditions of 50 keV and $6 \times 10^{16}/cm^2$ to form an ion-implanted layer.

Then, a nitrogen plasma treatment (a room temperature, a gas flow rate of 115 sccm, a pressure of 0.4 Torr (53.3 Pa), an output of 100 W, and 15 seconds) was applied to the surface of the oxide film on the bond wafer and a silicon single crystal surface (where approximately 1 nm of a natural oxide film is formed) of the base wafer. As a result, a film thickness of the oxide film on the bond wafer was 21 nm, and a film thickness of the oxide film on the base wafer was 4 nm.

Subsequently, the wafers subjected to the plasma treatment were immersed in an SC1 cleaning liquid and an SC2 cleaning liquid, and a liquid temperature and an immersion time were adjusted, thereby etching the oxide film on the bond wafer to reduce its film thickness by 2 nm and etching the oxide film on the base wafer to reduce its film thickness by 1.2 nm.

The plasma-treated surfaces of both the wafers having the etched oxide films were bonded at a room temperature, and then a delamination heat treatment was applied at 500° C. for 30 minutes to delaminate the bond wafer at a hydrogen-ion implanted layer, thereby fabricating a bonded wafer having a silicon thin film formed on the base wafer through a silicon oxide film. When the silicon thin film of the bonded wafer was observed to visually count the number of generated defects (voids, blisters), an excellent result was obtained. Table 1 shows a measurement result.

Examples 2 to 5, Comparative Examples 1 to 4

A bond wafer (having a 20 nm of a thermal oxide film and hydrogen ion implantation performed thereto) and a base wafer (having 1 nm of a natural oxide film) equal to those in Example 1 were prepared, a nitrogen plasma treatment and an oxide film etching treatment under the same conditions as those in Example 1 were carried out or not carried out in various combinations depicted in Table 1, and the number of defects generated in a silicon thin film of a bonded wafer was measured like Example 1. Table 1 shows a measurement result.

TABLE 1

|  | BOND WAFER (WITH INSULATOR FILM) | | BASE WAFER (WITHOUT INSULATOR FILM) | | NUMBER OF DEFECTS |
| --- | --- | --- | --- | --- | --- |
|  | PLASMA | ETCHING | PLASMA | ETCHING |  |
| EXAMPLE 1 | APPLIED | APPLIED | APPLIED | APPLIED | 5 |
| EXAMPLE 2 | APPLIED | APPLIED | APPLIED | NONE | 10 |
| EXAMPLE 3 | APPLIED | APPLIED | NONE | NONE | 16 |
| EXAMPLE 4 | APPLIED | NONE | APPLIED | APPLIED | 10 |
| EXAMPLE 5 | NONE | NONE | APPLIED | APPLIED | 1 |
| COMPARATIVE EXAMPLE 1 | APPLIED | NONE | APPLIED | NONE | 141 |
| COMPARATIVE EXAMPLE 2 | APPLIED | NONE | NONE | NONE | 137 |
| COMPARATIVE EXAMPLE 3 | NONE | NONE | APPLIED | NONE | 125 |
| COMPARATIVE EXAMPLE 4 | NONE | NONE | NONE | NONE | 293 |

Bonded wafers according to Comparative Examples 1 to 4 were fabricated under conditions that a silicon oxide film is grown by performing the plasma treatment according to the present invention and a treatment of etching the grown silicon oxide film to reduce a thickness thereof is not carried out with respect to any wafer bonding surface, and many defects were generated in each silicon thin film under such conditions, as shown in Table 1.

On the other hand, bonded wafers according to Examples 1 to 5 were fabricated under conditions that a silicon oxide film is grown by performing the plasma treatment according to the present invention and the treatment of etching the grown silicon oxide film to reduce a thickness thereof is carried out with respect to at least one of the bonding surfaces, and it can be understood that defects in each silicon thin film are clearly suppressed under such conditions.

In particular, when the plasma treatment and the etching treatment were performed with respect to the bonding surface of the base wafer having no thermal oxide film (an insulator film) without effecting the plasma treatment with respect to the bonding surface of the bond wafer having the thermal oxide film (the insulator film) formed thereon (Example 5), generation of defects was extremely suppressed. Further, when the thermal oxide film (the insulator film) was formed on one wafer alone and the bonding surfaces of both the wafers were subjected to the plasma treatment and the etching treatment like Example 1, the next excellent result to Example 5 was obtained.

Although a factor causing the number of generated defects to differ depending on bonding surface conditions in this manner is not clear, it is presumed that OH group or a concentration of moisture present on the surface of each bonding surface concerns.

Example 6

Two mirror-polished silicon single crystal wafers each having a diameter of 300 mm were prepared as a bond wafer and a base wafer, and a thermal oxide film having a thickness of 20 nm was formed as an insulator film on a surface of each of the bond wafer and the base wafer. Subsequently, a hydrogen ion was implanted through the thermal oxide film on the bond wafer under conditions of 50 keV and $6\times10^{16}/cm^2$ to form an ion-implanted layer.

Then, a nitrogen plasma treatment was applied to surfaces of the oxide films on both the wafers under the same conditions as those in Example 1, both the wafers subjected to the plasma treatment were immersed in an SC1 cleaning liquid and an SC2 cleaning liquid, and a liquid temperature and an immersion time were adjusted, thereby etching each oxide film to reduce its film thickness by 2 nm.

After the oxide film etching treatment, a bonded wafer was fabricated under the same conditions as those in Example 1, a silicon thin film of this bonded wafer was observed, and the number of generated defects was counted, whereby an excellent result was obtained. Table 2 shows a measurement result.

Comparative Example 5

A bonded wafer was fabricated under the same conditions as those in Example 6 except that an oxide film etching treatment was not carried out with respect to both wafers after the plasma treatment, the number of generated defects was counted, and it was thereby revealed that many defects were generated. Table 2 shows a measurement result.

TABLE 2

|  | BOND WAFER (WITH INSULATOR FILM) | | BASE WAFER (WITH INSULATOR FILM) | | NUMBER OF |
|---|---|---|---|---|---|
|  | PLASMA | ETCHING | PLASMA | ETCHING | DEFECTS |
| EXAMPLE 6 | APPLIED | APPLIED | APPLIED | APPLIED | 47 |
| COMPARATIVE EXAMPLE 5 | APPLIED | NONE | APPLIED | NONE | 194 |

Example 7

Two mirror-polished silicon single crystal wafers each having a diameter of 300 mm were prepared as a bond wafer and a base wafer, and a hydrogen ion was implanted into the bond wafer under conditions of 50 keV and $6\times10^{16}/cm^2$ to form an ion-implanted layer.

Further, a nitrogen plasma treatment was carried out with respect to one surface (having a natural oxide film of 1 nm) of each of both the wafers under the same conditions as those in Example 1 to effect growth until an oxide film thickness reaches 4 nm, both the wafers subjected to the plasma treatment were immersed in an SC1 cleaning liquid and an SC2 cleaning liquid, and a liquid temperature and an immersion time were adjusted, thereby etching each oxide film to reduce a film thickness thereof by 2 nm.

After the oxide film etching treatment, a bonded wafer was fabricated under the same conditions as those in Example 1, a silicon thin film of this bonded wafer was observed, and the number of generated defects was counted, whereby an excellent result was obtained. Table 3 shows a measurement result.

Comparative Example 6

A bonded wafer was fabricated under the same conditions as those in Example 7 except that an oxide film etching treatment was not performed with respect to both wafers after the plasma treatment, the number of generated defects was counted, and it was revealed that many defects were generated. Table 3 shows a measurement result.

TABLE 3

|  | BOND WAFER (WITHOUT INSULATOR FILM) | | BASE WAFER (WITHOUT INSULATOR FILM) | | NUMBER OF |
|---|---|---|---|---|---|
|  | PLASMA | ETCHING | PLASMA | ETCHING | DEFECTS |
| EXAMPLE 7 | APPLIED | APPLIED | APPLIED | APPLIED | 32 |
| COMPARATIVE EXAMPLE 6 | APPLIED | NONE | APPLIED | NONE | 152 |

(Confirmatory Experiment 1: Change to Oxygen Plasma)

A bonded wafer was fabricated under the same conditions as those in Examples 1 to 7 and Comparative Examples 1 to 6 except that the plasma treatment was changed to an oxygen plasma (a room temperature, a gas flow rate of 115 sccm, a pressure of 0.4 Torr (53.3 Pa), an output of 100 W, and 15 seconds), and the number of generated defects was counted for comparison. As a result, the same tendency as those of results obtained from Examples 1 to 7 and Comparative Examples 1 to 6 was confirmed. That is, many defects were generated in the silicon thin film of the bonded wafer fabricated under the conditions that the silicon oxide film was grown by performing the plasma treatment and the treatment of etching the grown silicon oxide film was not effected with respect to the bonding surface of any one of the wafers, and defects in the silicon thin film of the bonded wafer fabricated under the conditions that the silicon oxide film was grown by performing the plasma treatment and the treatment of etching the grown silicon oxide film was carried out with respect to at least one bonding surface were suppressed by more than 1 digit as compared with the former case.

(Confirmatory Experiment 2: Influence of Etching Amount)

A combination of the bond wafer (having the thermal oxide film of 20 nm) and the base wafer (having no thermal oxide film, the natural oxide film of 1 nm) according to Example 5 in which generation of defects was suppressed at a maximum in Examples 1 to 7 was utilized to examine a relationship between an etching amount (a thickness reduction amount) of the oxide film formed by the plasma treatment and generation of defects. At this time, the plasma treatment applied to the base wafer alone was performed by using an oxygen plasma, an oxide film thickness after the plasma treatment was changed to 4 nm, 5 nm and 6 nm as three conditions by varying a plasma treatment time, a bonded wafer was fabricated under a total of five conditions, i.e., four conditions which are 0.3 nm, 1 nm, 2 nm and 3 nm as etching amounts (thickness reduction amounts) of the oxide film obtained by adjusting a liquid temperature and an immersion time of the SC1 cleaning liquid and the SC2 cleaning liquid after the plasma treatment and no etching treatment (an etching amount of 0 nm), and defects generated in the silicon thin film were visually counted. Table 4 shows a measurement result.

TABLE 4

| | | OXIDE FILM THICKNESS AFTER PLASMA TREATMENT | | |
|---|---|---|---|---|
| | | 4 nm | 5 nm | 6 nm |
| THICKNESS REDUCTION AMOUNT BY ETCHING | 0 nm | 130 | 123 | 118 |
| | 0.3 nm | 0 | 1 | 1 |
| | 1 nm | 1 | 1 | 1 |
| | 2 nm | 18 | 9 | 6 |
| | 3 nm | 70 | 62 | 21 |

As shown in Table 4, even if the plasma treatment is applied to the base wafer, generation of defects is not greatly suppressed like Comparative Example 3 unless the etching treatment for the grown oxide film is performed. On the other hand, just performing etching for 0.3 nm enables greatly reducing defects. On the other hand, it was revealed that a defect suppressing effect is attenuated when the etching amount becomes equal to or above 2 nm. Therefore, setting the etching amount to 0.1 nm or above and less than 3 nm is preferable, and setting the same to 0.3 nm or above and less than 2 nm is more preferable.

It is to be noted that the present invention is not restricted to the foregoing embodiment. The foregoing embodiment is just an exemplification, and any examples that have substantially the same configuration and demonstrate the same functions and effects as the technical concept described in claims according to the present invention are included in the technical scope of the invention.

The invention claimed is:

1. A method for manufacturing a bonded wafer, the method including at least the steps of implanting at least one type of gas ion selected from a hydrogen ion and a rare gas ion into a surface of a bond wafer to form an ion-implanted layer in the bond wafer, bonding an ion-implanted surface of the bond wafer to a surface of a base wafer through an insulator film, and then delaminating the bond wafer at the ion-implanted layer to fabricate a bonded wafer,
the method further comprising applying a plasma treatment to a bonding surface of the base wafer to grow an oxide film; performing an etching treatment to the grown oxide film to reduce a film thickness of the oxide film by 0.3 nm or above and less than 2 nm; and then bonding the oxide film of the base wafer, that was subjected to the etching treatment, to the bond wafer that was ion-implanted.

2. The method for manufacturing the bonded wafer according to claim 1, wherein the treatment of etching the oxide film is carried out by immersion in an SC1 solution and an SC2 solution.

3. The method for manufacturing the bonded wafer according to claim 2, wherein an insulator film is formed on the surface of the bond wafer alone in advance.

4. The method for manufacturing the bonded wafer according to claim 2, wherein the plasma treatment is performed by using an oxygen plasma or a nitrogen plasma.

5. The method for manufacturing the bonded wafer according to claim 1, wherein an insulator film is formed on the surface of the bond wafer alone in advance.

6. The method for manufacturing the bonded wafer according to claim 1, wherein the plasma treatment is performed by using an oxygen plasma or a nitrogen plasma.

* * * * *